US008252678B2

(12) United States Patent
Zhang

(10) Patent No.: US 8,252,678 B2

(45) Date of Patent: Aug. 28, 2012

(54) FLUX-FREE CHIP TO WAFER JOINT SERIAL THERMAL PROCESSOR ARRANGEMENT

(75) Inventor: Jian Zhang, Brookline, MA (US)

(73) Assignee: SemiGear, Inc, Wakefield, MA (US)

( * ) Notice: Subject to any disclaimer, the term of this patent is extended or adjusted under 35 U.S.C. 154(b) by 0 days.

(21) Appl. No.: 12/930,203

(22) Filed: Dec. 31, 2010

(65) Prior Publication Data

US 2011/0198388 A1 Aug. 18, 2011

Related U.S. Application Data

(60) Continuation-in-part of application No. 12/653,454, filed on Dec. 14, 2009, now Pat. No. 7,982,320, which is a division of application No. 11/482,838, filed on Jul. 7, 2006, now Pat. No. 7,632,750, which is a continuation-in-part of application No. 10/832,782, filed on Apr. 27, 2004, now Pat. No. 7,008,879, which is a division of application No. 10/186,823, filed on Jul. 1, 2002, now Pat. No. 6,827,789.

(51) Int. Cl.
*H01L 21/44* (2006.01)

(52) U.S. Cl. ........ 438/612; 438/613; 438/615; 257/779; 257/E21.509; 257/E33.023; 257/E33.026; 228/46; 228/49.5

(58) Field of Classification Search .................. 257/779, 257/E21.508, E21.509, E33.023, E33.026; 438/612, 613, 615; 228/46, 49.5

See application file for complete search history.

(56) References Cited

U.S. PATENT DOCUMENTS 7,358,175 B2 * 4/2008 Zhang et al. .................. 438/612

* cited by examiner

*Primary Examiner* — A. Sefer
*Assistant Examiner* — Farid Khan
(74) *Attorney, Agent, or Firm* — Don Halgren

(57) ABSTRACT

A serial thermal processing arrangement for treating a pre-assembled chip/wafer assembly of semiconductor material in a rotary processor, through a series of intermittent, rotatively advanced, movements into independent, temperature and pressure controlled, circumferentially disposed chambers.

12 Claims, 2 Drawing Sheets

17
20
14
17
M
"W"
"D"
"V"
12
15
18
15
16
"H"

FLUX-FREE CHIP TO WAFER JOINT SERIAL THERMAL PROCESSOR ARRANGEMENT

BACKGROUND OF THE INVENTION

Field of the Invention

The present invention relates to an electronic chip and to a method of manufacturing same such as semiconductor wafers and more particularly to a stepwise process of a machine utilized in that manufacture of semiconductor wafers and is a continuation-in-part application of co-pending U.S. patent application Ser. No. 12/930,462 (Semigear-22) filed concurrently herewith, and wherein the present application claims the benefit of and is a CIP of Ser. No. 12/653,454, filed Dec. 14, 2009 now U.S. Pat. No. 7,982,320, which is a division of Ser. No. 11/482,838, filed Jul. 7, 2006, now U.S. Pat. No. 7,632,750, which is a CIP of Ser. No. 10/832,782, filed Apr. 27, 2004, now U.S. Pat. No. 7,008,879, which is a division of Ser. No. 10/186,823, filed Jul. 1, 2002, now U.S. Pat. No. 6,827,789, each incorporated herein by reference in the present Application.

DESCRIPTION OF THE PRIOR ART

Formation of a solder bump on a semiconductor substrate takes place when the semiconductor device is formed during a plating method, a printing method and a solder ball melting method. The solder is melted and joined to the connected material which may be wires and conductors or the like. In most prior art manufacturing methods utilizing solder, flux is used which is deposited on the surface of the terminal and the wiring. The flux typically covers the deposited surface while activating the surface to prevent new oxidation. Typically the solder is melted on the deposited surface and spreads over that surface and in the process, dissolves a portion of the flux. Removal of that flux is one of the problems common to the prior art. The flux in between the die and the wafer is impossible to perfectly clean, thereby reducing the reliability of the device produced.

Prior art machines are typically flux dispensers, reflow furnaces, and flux washers. Each particular solder material is often required to use a different flux and a different flux washing chemistry. Due to the nature of these materials and the chemicals, the machines of the prior art had to be designed to be suitable for the particular material and the particular chemistries. Due to the nature of fluxes utilized in the prior art, they adhere to the processing equipment and make that equipment very difficult to be cleaned. The use of fluxes requires a lot of chemical consumption and a lot of maintenance for the manufacturing process.

In the prior art, the vacuum system was utilized to heat the solder, to inject formic acid, and to minimize the voids and also form solder bumps or balls. By using a vacuum system for solder reflow, there are several disadvantages, such as the lack of heat transfer media. The heat transfer coefficient of solder is low, and low concentration of formic acid can be used to reduce the surface oxides, and no convection heat transfer can be used to form solder bumps or balls.

It is an object of the present invention to overcome the disadvantages of the prior art.

It is a further object of the present invention to minimize the steps of production which would otherwise be required for flux application and removal.

It is a further object of the present invention to provide a space-saving, step minimizing, rotary table manufacturing arrangement for loading, processing and unloading a series of wafers and dies in a series of adjustably controlled circumferentially arranged chambers for efficient chip development.

BRIEF SUMMARY OF THE INVENTION

The present invention relates to a method of manufacturing solder bumps and solder joints on a semiconductor material. The process in one aspect, involves the use of a treatment system comprising a rotary production table having six treatment positions or stations thereon, with mechanisms as may be seen in commonly owned U.S. Pat. Nos. 6,827,789 and 7,008,879 and 7,358,175, each of which are incorporated herein by reference.

The rotary production table is arranged to rotate components, so as to present a material to be treated, such as a pre-assembled semiconductor wafer, which each may comprise a plurality of individual chips to be processed, at a series of circumferential locations which each control the temperature, pressure and atmosphere thereat, as may be seen in various aspects and embodiments in the above-identified '789 and '879 patents, incorporated by reference herein.

The initial station where such devices such as the semiconductor chip/die wafer pre-soldered, spaced-apart component assemblies are loaded, are designated as the Load/Lock station for the purposes of defining a particular aspect of this invention.

At the Load/Lock station, a combination of a wafer or substrate with a pre-attached, pre-soldered but unjoined die thereadjacent, is loaded onto a support plate and subsequently enclosed within an enclosed climate controlled housing or chamber at the existing ambient atmospheric pressure and room temperature for about 10 to about 60 seconds. The chamber is purged with nitrogen or inert gas to remove air and moisture. The wafer having solder pads thereon and the chip or die having contiguous solder bumps co-aligned thereon, are tepidly pre-attached to one another by for example, thermal energy or ultrasound energy. That wafer/die loaded plate is then rotated to the next position designated station #1, At station #1, a heater arrangement associated with the chamber/station is preset at a temperature at a steady state of between 150 to 350° C. The chip/die or wafer pre-assembly is transferred into the station and a vacuum of about 10 m torr to about 300 torr is applied for between about 10 to 300 seconds for further removal of trapped air, moisture and reaction by-products. The chamber is then vented with a mixture of formic acid vapor and nitrogen, to atmospheric pressure. The pre-assembled wafer is heated under atmospheric pressure for the remaining time before it is indexed to the next station. This process removes trapped air and moisture to let the formic acid vapor react and remove oxides from the chip to wafer pre-assembly. The support plate containing the wafer and chip or die assembly is lowered from its enclosure housing and then rotated to the next position or subsequent station, which is designated station #2.

At station #2, the heater arrangement associated with the chamber/station is preset at a proper, solder-dependent temperature, at a steady state of between 150 to 350° C. The chip/die or wafer pre-assembly is transferred into the station and a vacuum of about 10 m torr to about 300 torr is applied for between about 10 to 300 seconds for further removal of trapped air and moisture. The chamber is then vented with formic acid vapor and nitrogen to atmospheric pressure. The pre-assembly wafer is heated under atmospheric pressure for the remaining index time. This process removes trapped air and moisture to let the formic acid vapor react and remove oxides from the chip to wafer pre-assembly. The support plate containing the wafer and chip or die assembly is then lowered (removed) from its enclosure housing and then rotated to the next position or subsequent station, which is designated station #3.

At station #3, the heater arrangement associated with the chamber/station is preset at a temperature at a steady state of between 150 to 350° C. The chip/die or wafer pre-assembly is transferred into the station chamber and a vacuum of about 10 m torr to about 300 torr is applied for between about 10 to 300 seconds for further removal of trapped air, moisture and reaction by-products. The chamber has been vented with a mixture of formic acid vapor and nitrogen to atmospheric pressure. The pre-assembly wafer is heated under atmospheric pressure for the remaining index time. This process removes trapped air and moisture to let the formic acid vapor react and remove oxides from the chip to wafer pre-assembly. The support plate containing the wafer and chip or die assembly is lowered from its enclosure housing chamber and then stepwise rotated to the next position or subsequent station, which is designated station #4. It is to be noted that the processing temperatures at these stations is individually controlled and regulated based upon the nature of the particular solder utilized/required for a particular run of wafer/semiconductors being assembled.

At station #4 the heater arrangement associated with the plate is preset at a temperature at a steady state of between 150 to 350° C., for between about 10 to 300 seconds, and which temperature also at this station, is preferably to be above the melting temperature of the solder utilized in the solder bumps and the solder pads contiguous to the chip or die and the wafer, respectively. The length of time of holding above melt temperature is dependent upon the composition of the solder. The chip/die or wafer pre-assembly is transferred into the station chamber and a vacuum of about 10 m torr to about 300 ton may be applied for further removal of trapped air, moisture and reaction by-products. The chamber is vented with a mixture of formic acid vapor and nitrogen at atmospheric pressure. This station #4 performs the final melt-joining of the solder ball of the chip or die to the solder pad of the wafer. The support plate containing the wafer and chip or die assembly, after the proper timed indexing is complete, is moved from its enclosure housing and then rotated to the next position or subsequent station, which is designated station #5.

At station #5, the chamber and support plate carrying the wafer or die pre-assembly is maintained at room temperature of between about 20 to 30° C. or lower, with pressure at atmospheric and a flowing nitrogen or inert gas ambient, for a period of time of between about 10 to about 300 seconds, so as to cool the solder mating the chip or die and wafer together, prior to its transfer to the Load/Lock station for the now joined, assembled wafer's removal therefrom, and for its subsequent further manufacturing processes therewith.

The final step within the serial thermal processing portion of this wafer treatment thus occurs when the wafer is sequentially rotated (and hence returned) to the Load/Lock station, where the joined, treated chip or die and wafer assembly or substrate in the chamber is purged with nitrogen for about 10 to 60 seconds, then is unloaded from its plate in the chamber and a new untreated wafer substrate is then placed on that now vacant plate for subsequent shuttling to the chamber of station #1 for its further sequential advance through the stations #1 through station #5 on the treatment apparatus.

The processing parameters at each particular station are set so to cover all particular solders which may include high lead, eutectic, and lead free solder.

The treatment details of the system thus include:

Load/Lock station: a pre-assembled (pre-soldered, un-melted components, set in place adjacent and aligned with one another by thermal or ultrasound energy) chip of die on a wafer is loaded onto its support plate, purged with nitrogen or inert gas, at room temperature and atmospheric pressure, whereupon it is rotated to station #1;

At station #1, a heater arrangement associated with the plate in this chamber is preset at a temperature at a steady state of between 150 to 350° C. The chip/die or wafer pre-assembly is transferred into the station and a vacuum of about 10 m torr to about 300 torr is applied for between about 10 to 300 seconds for further removal of trapped air and moisture. The chamber is then vented with a mixture of formic acid vapor and nitrogen, to atmospheric pressure. The pre-assembly wafer is thus heated under atmospheric pressure for the remaining time before it is indexed to the next station. This process removes trapped air, moisture and reaction by-products to let the formic acid vapor react and remove oxides from the chip to wafer pre-assembly. The support plate containing the wafer and chip or die assembly is lowered from its enclosure housing and then rotated to the next position or subsequent station, which is designated station #2.

At station #2, the heater arrangement associated with the plate is preset at a temperature at a steady state of between 150 to 350° C. The chip/die or wafer pre-assembly is transferred into the station and a vacuum of about 10 m torr to about 300 torr is applied for between about 10 to 300 seconds for further removal of trapped air and moisture. The chamber is then vented with formic acid vapor and nitrogen to atmospheric pressure. The pre-assembly wafer is heated under atmospheric pressure for the remaining index time. This process removes trapped air and moisture to let the formic acid vapor react and remove oxides from the wafer pre-assembly. The support plate containing the wafer and chip or die assembly is then lowered from its enclosure housing chamber and then rotated to the next position or subsequent station, which is designated station #3.

At station #3, the heater arrangement associated with the plate is preset at a temperature at a steady state of between 150 to 350° C. The chip/die or wafer pre-assembly is transferred into the station and a vacuum of about 10 m torr to about 300 ton is applied for between about 10 to 300 seconds for further removal of trapped air and moisture. The chamber has been vented with a mixture of formic acid vapor and nitrogen to atmospheric pressure. The preassembly wafer is heated under atmospheric pressure for the remaining index time. This process again removes further trapped air and moisture to let the formic acid vapor react and remove oxides from the wafer pre-assembly. The support plate containing the wafer and chip or die assembly is lowered from its enclosure housing and then stepwise rotated to the next position or subsequent station, which is designated station #4. It is to be noted that the processing temperatures at these stations is controlled and regulated based upon the nature of the particular solder utilized/required for a particular run of wafer/semiconductors being assembled.

At station #4 the heater arrangement associated with the plate is preset at a temperature at a steady state of between 150 to 350° C., for between about 10 to 300 seconds, and which temperature also is to be above the melting temperature of the solder utilized in the solder bumps and the solder pads contiguous to the chip or die and the wafer, respectively. The length of time of holding above melt temperature is dependent upon the composition of the solder. The chip/die or wafer pre-assembly transferred into the station and a vacuum of about 10 m torr to about 300 torr is applied for further removal of trapped air and moisture. The chamber is vented with a mixture of formic acid vapor and nitrogen at atmospheric pressure. This station #4 performs the final melt-joining of the solder ball of the chip or die to the solder pad of the wafer. The support plate containing the now joined (by virtue of the solder being melted) wafer and chip or die assembly is moved from its enclosure housing and then rotated to the next position or subsequent station, which is designated station #5.

At station #5, the support plate carrying the wafer or die pre-assembly is maintained at room temperature of between about 20 to 30° C. or lower, with pressure at atmospheric and a flowing nitrogen ambient, for a period of time of between about 10 to about 300 seconds, so as to cool the solder mating the chip or die and wafer together, prior to its transfer to the Load/Lock station for the now joined, assembled wafer's removal therefrom, and for its subsequent further manufacturing processes therewith.

The final step within the serial thermal processing portion of this wafer treatment thus occurs when the wafer is sequentially rotated to the Load/Lock station, where the joined, treated chip or die and wafer assembly or substrate in the chamber is purged with nitrogen for about 10 to 60 seconds, then is unloaded from its plate in the chamber and a new untreated wafer substrate is then placed on that now vacant plate for subsequent shuttling to the chamber #1 for its further sequential advance through the stations #1 through station #5 on the treatment apparatus.

The processing parameters at each particular station are set so to cover all particular solders which may include high lead, eutectic, and lead free solder.

The reflowing of high lead, eutectic and lead free solders are completed with one treatment of formic acid, wherein that wafer configuration is treated by the introduction of formic acid into the chambers at certain stations at atmospheric pressure. Removal or minimizing the voids inside the solder during the solder reflow by the application of a vacuum occurs after the surface oxides have been reduced and the solder has been melted.

Solder reflow is important in the semiconductor manufacturing process. Such reflow accomplishes the reduction of surface oxides on the solder bumps or balls. It helps form the inter-metallic layer, it removes or minimizes the voids within the solder bumps or balls, the process forms solder compounds, and it permits the performing of shiny and spherical solder bumps or balls on the semiconductor wafer material.

The present invention however, requires only one chemical, such as a formic acid, to effectively reduce the surface oxides of lead, tin, copper and silver. The formic acid may also be utilized to reduce surface oxides of high lead solders such as lead and tin compounds, eutectic solders, and lead free solder as well as silver, tin or silver and copper compounds.

By using a stepped, independent, multi-chamber rotary machine such as utilized with the present invention, removal of moisture on the surface can be easily accomplished. Removal of surface oxides or the minimization of voids inside the solder bumps or balls may be accomplished. The forming of inter-metallic layer and a shiny smooth solder bump or ball is thus permitted in a multi-station rotating machine as of the present invention. By applying formic acid under atmospheric pressure, a large amount of formic acid molecules are thus available for the oxide reduction process.

By also applying the formic acid under atmospheric pressure, mechanical system for delivery of the chemical is easy and controllable. Because of the pressure utilized, the heating system is able to permit uniformed and controlled heating of a wafer or semiconductor assembly thereon. Under atmospheric pressure, the transferring of heat away from the healing system to the solder is more efficient. This is especially true because the wafer size in modem semiconductor manufacturing is much larger and the system requirements are much higher.

The formation of solder bumps or balls are formed in a improved manner when it is done so under atmospheric pressure because the conduction by heating or cooling can be accomplished more efficiently. The initial heating and cooling of solder bumps or balls at atmospheric pressure and subsequent heating and applying of a vacuum at elevated temperatures permits the pressure inside of the voids to draw those voids to the surface. Such voids are then easily removed.

The invention thus comprises a serial thermal processing arrangement for treating a pre-assembled chip/wafer assembly of semiconductor material in a rotary processor, through a series of independent circumferentially disposed chambers, comprising the steps of: loading the pre-assembled chip/wafer into a Load/Lock chamber at an initial station of the processor, on a rotatable table at atmospheric pressure and purging the chamber with nitrogen gas; rotating the plate and supported assembly for heating the pre-assembled chip/wafer assembly at the first processing station (#1), applying a vacuum to the chamber, introducing formic acid vapor and nitrogen, heating said wafer at ambient atmospheric pressure; rotating the pre-assembled chip/wafer assembly to a second chamber or station (#2), heating the pre-assembled chip/wafer assembly, holding a vacuum, and introducing a formic acid vapor vent; rotating the pre-assembled chip/wafer assembly to a third chamber or station (#3), heating the pre-assembled chip/wafer assembly, holding a vacuum, and introducing a formic acid vapor vent; rotating the pre-assembled chip/wafer assembly to a fourth station, introducing formic acid vapor vent while, heating the pre-assembled chip/wafer assembly at an elevated temperature to melt the solder between the chip/wafer assembly; rotating the pre-assembled chip/wafer assembly to a fifth subsequent station (#5), and cooling the now joined pre-assembled chip/wafer assembly at ambient atmospheric pressure; and returning the assembly to the Load/Lock station by rotating the joined chip/wafer assembly for unloading the joined chip/wafer assembly thereat, and for subsequent re-loading with a fresh pre-assembled chip/wafer assembly. The first and second stations are heated to about 150° C. to about 350° C. The first, second and third stations are held at a vacuum for preferably about 10 to 300 seconds. The fourth or solder-melting station is heated to a temperature of preferably about 150° C. to about 350° C. The first chamber is purged with nitrogen for a period of about 10 to about 60 seconds. The third chamber is preferably heated to a temperature of between about 150° C. to about 350° C. for a time of about 10 to about 300 seconds. The fourth chamber is preferably heated to a solder melt temperature anywhere in the range between about 150° C. to about 350° C., at atmospheric pressure (about 760 torr) for a period of about 10 to about 300 seconds. The fifth chamber preferably chills the chip/wafer assembly to about 20° C. to about 30° C. for a period of time about 10 to about 300 seconds.

The invention also covers an electronic chip/wafer assembly made by a serial thermal processing arrangement for treating a pre-assembled chip/wafer assembly of semiconductor material in a rotary processor, through a series of independent, circumferentially disposed chambers, comprising the steps of: loading the pre-assembled chip/wafer onto a support plate in a chamber at an initial Load/Lock station of the processor, the support plate mounted on a rotatable table at atmospheric pressure and purging the chamber with nitrogen gas;

rotating into a first station, and heating the pre-assembled chip/wafer assembly at the first station, introducing formic acid vapor and nitrogen, heating the wafer at ambient atmospheric pressure;

rotating the pre-assembled chip/wafer assembly to a second chamber or station, heating the pre-assembled chip/wafer assembly, holding a vacuum, and introducing a formic acid vapor vent;

rotating the pre-assembled chip/wafer assembly from the second station to a third chamber or station, heating the pre-assembled chip/wafer assembly, holding a vacuum, and introducing a formic acid vapor vent;

rotating the pre-assembled chip/wafer assembly from the third station to a fourth station, introducing formic acid vapor vent while, and heating the pre-assembled chip/wafer assembly at an elevated temperature to melt the solder between the chip and the wafer to join the chip and the wafer;

rotating the heated, joined chip/wafer assembly to a fifth subsequent station, and cooling the now joined pre-assembled chip/wafer assembly at ambient atmospheric pressure; and rotating the joined chip/wafer assembly from the fifth station back to the Load/Lock station for unloading the joined chip/wafer assembly from the chamber at the Load/Lock station; wherein the first and second stations are heated to about 150° C. to about 350° C., and wherein the first and second stations are held at a vacuum for about 10 to about 300 seconds, wherein the first, the second and the third stations have common time, pressure and temperature conditions therein, and wherein the fourth station is heated to a temperature of about 150° C. to about 350° C., and wherein the first chamber is purged with nitrogen for a period of about 10 to about 60 seconds, and wherein the third chamber is heated to a temperature of between about 150° C. to about 350° C. for a time of about 10 to about 300 seconds, and wherein the fourth chamber is heated to a temperature of about 150° C. to about 350° C., at a pressure of about 760 torr for a period of about 10 to about 300 seconds, and wherein the fifth chamber chills the chip/wafer assembly to about 10° C. to about 30° C. for a period of time about 10 to about 300 seconds.

BRIEF DESCRIPTION OF THE DRAWINGS

The objects and advantages of the present invention will become more apparent when viewed in conjunction with the following drawing in which.

DETAILED DESCRIPTION OF THE INVENTION

Figure 1:
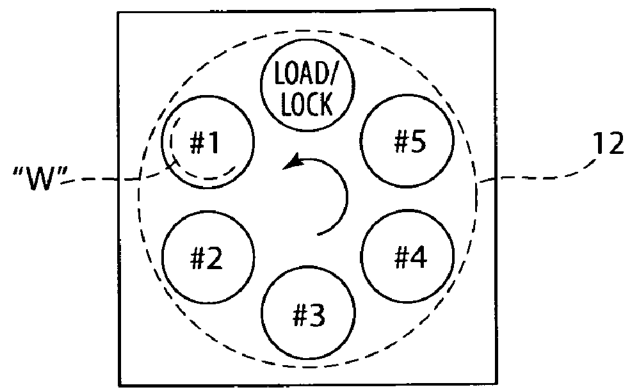
FIG. 1 is a plan view of a rotary, serial thermal process machine for the stepwise, rotative treatment of chip or die and wafer assemblies.

The invention a an electronic chip and chip manufacturing process which comprises a rotatable, circumferentially organized, serial thermal processing station arrangement 10 using a method for serially treating a pre-assembled chip or die and a wafer assembly "W" through a series of preferably at least six independent, enclosed station chambers in the processor arrangement 10, as represented in FIG. 1.

The rotary production station arrangement 10 is arranged to rotate so as to present a material to be treated, such as a semiconductor wafer, at a series of circumferentially spaced-apart locations, from a Load/Lock station to processing stations numbered 1 through 5, which stations each are arranged to independently control the temperature, pressure and atmosphere thereat, as is similarly represented in various aspects and embodiments of the arrangement 10, in a mechanism as may be shown in the above-identified '789 and '879 patents, incorporated by reference herein.

Figure 2:
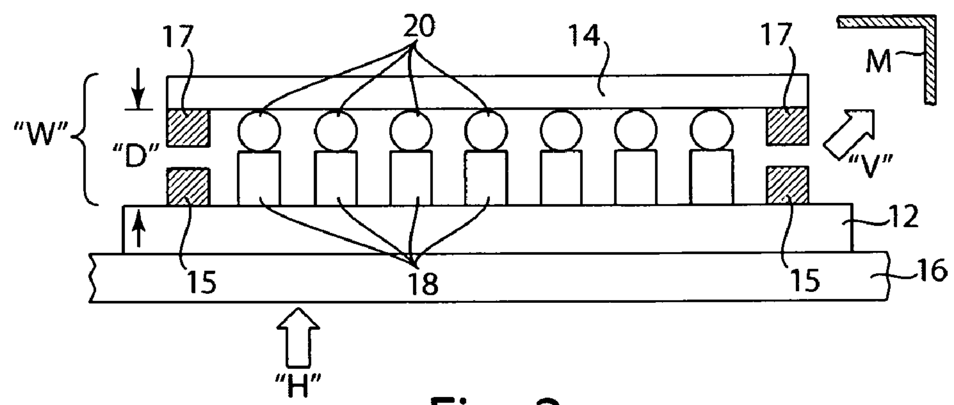
FIG. 2 is a side elevation representation of a chip or die disposed above a chip or die and a wafer with a solder arrangement therebetween, undergoing a first step of the inventive process.
Figure 3:
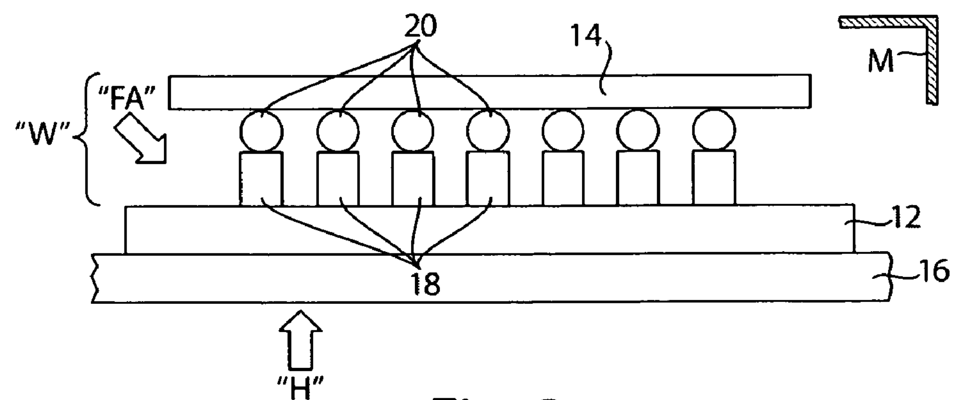
FIG. 3 is a side elevation representation similar to that shown in FIG. 2 when a chip or die and a wafer assembly are undergoing a second step of the inventive process of the present invention.
Figure 4:
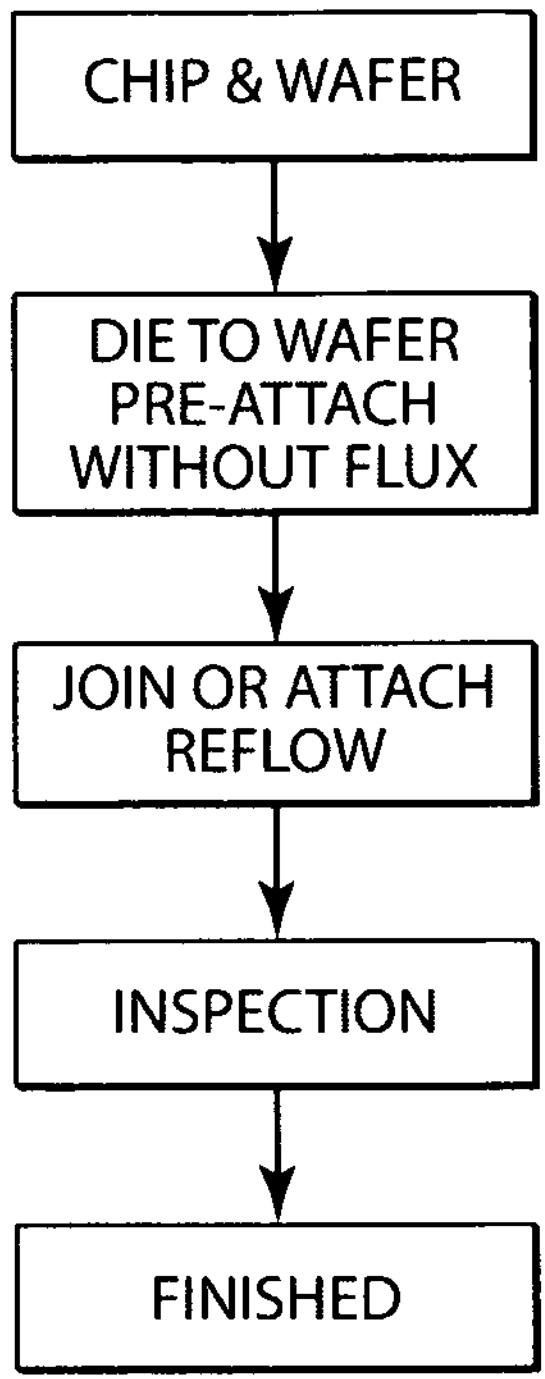
FIG. 4 is a schematic presentation of a chip and wafer assembly showing the steps involved in the processing thereof.

The initial station where such devices such as the semiconductor chip/die wafer assemblies "W" are loaded, is designated the Load/Lock station, as shown in FIG. 1, for the purposes of defining a particular aspect of this invention. At that Load/Lock station, a combination of a wafer or substrate 12, with a pre-attached chip or die 14, as represented in FIGS. 2 and 3, is loaded onto a support plate 16 and subsequently enclosed within an enclosed climate controlled chamber or housing M at the existing ambient or atmospheric pressure of the processing arrangement 10. The wafer 12 has solder pads 18 pre-arranged thereon and the chip or die 14 has contiguous solder bumps 20 co-aligned and pre-arranged thereon, which are "tepidly" pre-attached to one another, by for example, thermal energy or ultrasound energy, prior to their placement onto the support plate into the Load/Lock station of the processing arrangement 10. The chip or die 14 and the wafer 12 are typically spaced apart a distance "D" of about 10 to 500 microns from one another in this assembly process.

A peripheral solder "sealing" line 15 and 17 may be arranged around the periphery of the individual wafer 12 and the chip or die 14 assemblies respectively, as represented in FIG. 2. The solder comprising the lines 15 and 17 may be a higher melting solder than that used on bumps 20 and the pads 18, so that the area between the wafer 12 and the chip or die 14 may be "cleansed" and vacuumed of oxides and reaction by-products before the wafer W assembly's periphery is hermetically sealed by melting the peripheral solder lines 15 and 17 together, preferably at one of the latter processing stations herein.

That loaded housing or first processing chamber (#1) then has a vacuum applied by a proper vacuum means "V" of about 10 m torr to about 300 torr, applied for about 10 to 300 seconds, to remove trapped air, moisture and oxygen, and then purged with nitrogen and in a second phase therein, subsequently heated by a proper heating means "H" to a set, constant temperature of between 150° C. to about 350° C., as represented in FIG. 2, and then undergoes a vent of formic acid FA and nitrogen, to atmosphere.

The support plate 16 containing the wafer and chip or die assembly W is then rotatively indexed to the next position or next subsequent, which is designated station #2, which generally repeats the process of station #1. The atmosphere in the chamber at station #2 is held at a vacuum for about 10 to, 300 seconds to remove air, moisture or by-products, then vented with formic acid FA vapor to remove oxides, as represented in FIG. 3. The chip/die and wafer assembly "W" on the support plate 16 within the chamber #2 is also heated "H" by convection and/or conduction in a controlled manner at a temperature between about 150° to about 350° C., as also represented in FIG. 2. The processing temperature at this station #2 is controlled and regulated based upon the nature of the solder utilized for a particular run of wafer/semiconductors.

The chip/die and wafer assembly "W" on the plate 16 thus leaves station #2 and is stepwise rotated to a subsequent station #3 by controlled rotation of the table on which the support plate 16 is disposed. The atmosphere in station #3 is similar to the process of station #2 wherein the atmosphere at station #3 is held at a vacuum for about 10 to 300 seconds, then vented with formic acid vapor FA and nitrogen, to remove undesired oxides and reaction by-products. The chip/die and wafer assembly "W" on the support plate 16 while within the chamber or station #3 is also heated "H" by proper convection and/or conduction in a controlled manner at a set (solder composition dependent) constant temperature anywhere between about 150° to about 350° C. for about 10 to about 300 seconds.

Thereafter, the chip/die and wafer assembly "W" on the plate 16 in station #3 is stepwise rotated to a subsequent station #4 by controlled rotation of the table on which the support plate 16 is disposed. The atmosphere in station #4 is heated at a solder melting elevated temperature by proper heating means "H" of about 150° C. to about 350° C. for an extended period of time of about 10 to about 300 seconds by proper convection and/or conduction in a controlled manner, depending upon the melt requirements of the particular solder compound.

Thereafter. the chip or die and wafer assembly "W" on the plate 16 is caused to stepwardly depart station #4 and is stepwise rotated to a subsequent cooling station #5 by controlled rotation of the table on which the support plate 16 is disposed. The atmosphere in station #5 changes the process of station #4 wherein the atmosphere at station #5 is flowing nitrogen, and the now joined wafer assembly "W" is chilled for example, to a temperature (room) of about 20° C. to about 30° C., or lower, for a period of time of about 10 to about 300 seconds, so as to cool the solder mating the chip or die and wafer assembly "W" properly together prior to its transfer (returned) to the final or Load/Lock station for unloading and removal therefrom, and for its subsequent further manufacturing processes therewith.

The final step within the serial thermal processing portion of this wafer treatment, thus occurs when the wafer is sequentially rotated to the Load/Lock station where the joined and treated chip or die and wafer assembly or substrate "W" is unloaded from its final chamber and a new untreated wafer substrate is then placed on that now vacant plate after shuttling to the location for station chamber #1 for its further sequential advance through the stations 1 through 5 on the treatment apparatus 10. The processing parameters at each particular station are set so to cover all particular solders which may include high lead, eutectic, and lead free solder.

The invention claimed is:

1. A serial thermal processing arrangement for treating a pre-assembled chip/wafer assembly of spaced-apart, pre-soldered semiconductor components in a rotary processor, through a series of independent, circumferentially disposed chambers, wherein:

a pre-assembled chip/wafer is loaded onto a support plate in a chamber at an initial Load/Lock station of the rotary processor, the support plate being mounted on a rotatable table at atmospheric pressure and wherein the chamber is purged with nitrogen gas;

the pre-assembled chip/wafer is rotated into a heated first treatment chamber or station to heat the pre-assembled chip/wafer assembly, wherein the first chamber is held below atmospheric pressure, and formic acid vapor is introduced;

the pre-assembled chip/wafer assembly is rotated to a heated second chamber or station, and the second chamber is held at a vacuum, and a formic acid vapor is introduced;

the pre-assembled chip/wafer assembly is rotated from the second station to a heated third chamber or station and held to a vacuum, and wherein a formic acid vapor vent is introduced;

the pre-assembled chip/wafer assembly is rotated from the third station to a fourth station, and the pre-assembled chip/wafer assembly is heated at an elevated solder-melt temperature to melt the solder between the spaced-apart chip and wafer to electrically join the chip and the wafer, wherein a formic acid vapor vent is introduced;

the heated, joined chip/wafer assembly is rotated to a fifth subsequent station, and the joined pre-assembled chip/wafer assembly is cooled at ambient atmospheric pressure; and the joined chip/wafer assembly is rotated from the fifth station back to the Load/Lock station and the joined chip/wafer assembly is unloaded from the chamber at the Load/Lock station.

2. The serial thermal processing arrangement as recited in claim 1, wherein the first station is heated to a constant temperature of from about 150° C. to about 350° C.

3. The serial thermal processing arrangement as recited in claim 1, wherein the first and second stations are held at a vacuum for about 10 to about 300 seconds.

4. The serial thermal processing arrangement as recited in claim 1, wherein the first, the second and the third stations each utilize similar time, pressure and temperature treatment parameters.

5. The serial thermal processing arrangement as recited in claim 1, wherein the fourth station is heated to a temperature of about 150° C. to about 350° C.

6. The serial thermal processing arrangement as recited in claim 1, wherein the Load/Lock station is purged with nitrogen for a period of about 10 to about 60 seconds.

7. The serial thermal processing arrangement as recited in claim 1, wherein the third station is heated to a temperature of between about 150° C. to about 350° C. for a time of about 10 to about 300 seconds.

8. The serial thermal processing arrangement as recited in claim 1, wherein the fourth station is heated to a solder melting temperature between about 150° C. to about 350° C., at a pressure of about 760 torr for a period of about 10 to about 300 seconds.

9. The serial thermal processing arrangement as recited in claim 1, wherein the fifth station chills the chip/wafer assembly to about 10° C. to about 30° C. for a period of time about 10 to about 300 seconds.

10. A serial thermal processing arrangement for treating a pre-assembled, spaced-apart, chip/wafer assembly of semiconductor components in a rotary processor, through a series of independent, circumferentially disposed chambers, wherein:

a pre-assembled chip/wafer is loaded onto a support plate in a chamber at an initial Load/Lock station of the processor arrangement, the support plate being mounted on a rotatable table at atmospheric pressure wherein the chamber is purged with nitrogen gas;

the pre-assembled chip/wafer assembly is rotated into a first chamber or station, and the pre-assembled chip/wafer assembly is heated at the first station, the pre-assembled chip/wafer assembly being held in a vacuum, and formic acid vapor and nitrogen vent is introduced therein;

the pre-assembled chip/wafer assembly is rotated to a second chamber or station, the pre-assembled chip/wafer assembly heated, and held in a vacuum, and wherein a formic acid vapor and nitrogen vent is introduced therein;

the pre-assembled chip/wafer assembly being rotated from the second station to a heated third chamber or station while being held in a vacuum, and wherein a formic acid vapor and nitrogen vent is introduced;

the pre-assembled chip/wafer assembly is rotated from the third station to a fourth station, the pre-assembled chip/wafer assembly being heated at an elevated temperature to melt the solder between the chip and the wafer to join the chip and the wafer, and wherein a formic acid vapor and nitrogen vent is introduced;

the heated, joined chip/wafer assembly is rotated to a fifth station, the now joined pre-assembled chip/wafer assembly being cooled at ambient atmospheric pressure; and the joined chip/wafer assembly is rotated from the fifth station back to the Load/Lock station and the electrically joined chip/wafer assembly is unloaded from the chamber at the Load/Lock station, wherein the first and second stations are heated to about 150° C. to about 350° C., and wherein the first and second stations are held at a vacuum for about 10 to about 300 seconds, wherein the first, the second and the third stations have common time, pressure and temperature parameters therein, and wherein the fourth station is heated to a solder melt temperature of between about 150° C. to about 350° C., and wherein the first chamber is purged with nitrogen for a period of about 10 to about 60 seconds, and wherein the third chamber is heated to a temperature of between about 150° C. to about 350° C. for a time of about 10 to about 300 seconds, at a pressure of about 760 torr for a period of about 10 to about 300 seconds, and wherein the fifth chamber chills the chip/wafer assembly to about 10° C. to about 30° C. for a period of time about 10 to about 300 seconds.

11. The thermal processing arrangement as recited in claim 10, wherein the chip and wafer assembly are spaced apart a distance of about 10 to 500 microns.

12. A chip/wafer assembly made by a serial thermal processing arrangement for treating a pre-assembled chip/wafer assembly of semiconductor material in a rotary processor, through a series of independent, circumferentially disposed chambers, comprising the steps of:

loading the pre-assembled chip/wafer onto a support plate in a chamber at an initial Load/Lock station of the processor, the support plate mounted on a rotatable table at atmospheric pressure and purging the chamber with nitrogen gas;

rotating the assembly into a first station, and heating the pre-assembled chip/wafer assembly at the first station, introducing formic acid vapor and nitrogen, heating said wafer at ambient atmospheric pressure; rotating the pre-assembled chip/wafer assembly to a second chamber or station, heating the pre-assembled chip/wafer assembly, holding a vacuum, and introducing a formic acid vapor;

rotating the pre-assembled chip/wafer assembly from the second station to a third chamber or station, heating the pre-assembled chip/wafer assembly, holding a vacuum, and introducing a formic acid vapor vent;

rotating the pre-assembled chip/wafer assembly from the third station to a fourth station, heating the pre-assembled chip/wafer assembly at an elevated temperature to melt the solder between the chip and the wafer to join the chip and the wafer, and introducing a formic acid vapor vent;

rotating the joined chip/wafer assembly to a fifth station, and cooling the now joined pre-assembled chip/wafer assembly at ambient atmospheric pressure; and rotatively advancing the joined chip/wafer assembly from the fifth station to the Load/Lock station for unloading the now joined chip/wafer assembly from the chamber at the Load/Lock station, and wherein the first and second stations are heated to about 150° C. to about 350° C., and wherein the first and second stations are held at a vacuum for about 10 to about 300 seconds, wherein the first, the second and the third stations have common time, pressure and temperature parameters therein, and wherein the fourth station is heated to a solder melt temperature anywhere between about 150° C. to about 350° C., and wherein the first chamber is purged with nitrogen for a period of about 10 to about 60 seconds, and wherein the third chamber is heated to a temperature of between about 150° C. to about 350° C. for a time of about 10 to about 300 seconds, and wherein the fourth chamber is heated to a solder melt temperature anywhere between about 150° C. to about 350° C., at a pressure of about 760 ton for a period of about 10 to about 300 seconds, and wherein the fifth chamber chills the chip/wafer assembly to about 10° C. to about 30° C. for a period of time about 10 to about 300 seconds.

* * * * *